United States Patent [19]

Goto et al.

[11] 4,151,422

[45] Apr. 24, 1979

[54] ELECTRON BEAM EXPOSURE METHOD

[75] Inventors: Eiichi Goto, Fujisawa; Takashi Souma, Kiyose; Masanori Idesawa, Wako; Tetsuo Yuasa, Akishima, all of Japan

[73] Assignees: Rikagaku Kenkyusho, Saitama; Nihon Denshi Kabushiki Kaisha, Tokyo, both of Japan

[21] Appl. No.: 913,397

[22] Filed: Jun. 7, 1978

[30] Foreign Application Priority Data

Jun. 30, 1977 [JP] Japan ................................ 52-78189

[51] Int. Cl.² ................................................ A61K 27/02

[52] U.S. Cl. ............................ 250/492 A; 250/396 R; 250/492 R

[58] Field of Search ................ 250/492 A, 492 R, 396

[56] References Cited

U.S. PATENT DOCUMENTS

| | | | |
|---|---|---|---|
| 3,491,236 | 1/1970 | Newberry | 250/492 A |
| 3,875,416 | 4/1975 | Spicer | 250/492 A |
| 3,922,546 | 11/1975 | Livesay | 250/492 A |
| 4,017,403 | 4/1977 | Freeman | 250/492 A |
| 4,117.340 | 9/1978 | Goto et al. | 250/492 A |

*Primary Examiner*—Harold A. Dixon
*Attorney, Agent, or Firm*—Webb, Burden, Robinson & Webb

[57] ABSTRACT

An electron beam having a narrow rectangular cross section, shaped by two aperture plates and a deflector, is scanned over a workpiece or specimen. The length and width of the narrow rectangular cross section, relative to beam scanning, in accordance with the shape of the pattern being exposed.

7 Claims, 6 Drawing Figures

COMPUTER
D-A CONVERTER
D-A CONVERTER
D-A CONVERTER
D-A CONVERTER
AMP
AMP
AMP
AMP
1
2
3
4
5
6
7
8
9
10
11
12
13
14
15
16
17
18
19
20
21

Vxp+H
(a)
Vxp
0
t
T
VYP
(b)
VYP-V
0
t
VM
(c)
VL
0
t
(d)
TQ
VN
0
t
VYP
(e)
0
t

0
Xp
H
X
R
Q
Yp
V
P
Q'
L
M
Nx
C
N
N1
N2
N3
N4
Y

0
Xp
9
X
Yp
EB1
EB2
EB3
EB4
F
EB5
P
R
H

ELECTRON BEAM EXPOSURE METHOD

This invention relates in general to an electron beam exposure method and in particular to an electron beam exposure method wherein two apertured plates and a deflector vary the shape and size of the electron beam cross section.

Recently, an electron beam exposure method was proposed in which two plates having multi-sided apertures, an electron lens and a deflector located between two apertured plates, are arranged in the electron beam path. (See U.S. patent application Ser. No. 801,812, filed May 31, 1977, now U.S. Pat. No. 4,117,340, entitled "Electron Beam Exposure System"). The electron lens serves to focus the image of the upper aperture plate on the lower aperture plate. The deflector serves to vary the shape and size of said electron beam cross section through the combined interceptive action of said two apertured plates. An electron beam having an optional multi-sided cross-section is passed through the hole of the lower aperture plate and is projected onto a workpiece, thus enabling the desired pattern to be exposed. An advantage of said exposure method is that the exposure speed is much better than that of the prior art in which the pattern is scanned with a finely focused electron beam. Further, it is easy to expose rectangular patterns as their corresponding sides lie parallel to the X and Y axes of the workpiece, respectively. It is also comparatively easy to expose parallelogram-shaped patterns, even though one pair of sides is not parallel with the corresponding sides of the workpiece, by scanning the workpiece with an electron beam having a rectangular cross-section of specific shape and size in a direction inclined at a fixed angle with respect to the X-, or Y-axis. However, in the case of trapeziums and trapezoidal-shaped patterns, exposure is a lengthy process. The exposed shapes must be divided into a large number of rectangles and parallograms which are individually exposed. A certain lack of precision is inevitable due to the multiplicity of superimpositions necessary to expose such patterns through parallelogram and rectangular scanning.

Accordingly, one object of this invention is to provide an electron beam exposure method capable of exposing patterns of any desired shape and size by varying the length of the electron beam's narrow rectangular cross-section relative to beam scanning.

Another object of said invention is to improve the exposure accuracy, particularly with respect to the edges of the pattern, by gradually reducing the width of the cross section to zero after completing a predetermined amount of scanning time, and/or by gradually increasing the width of said cross section from zero to a predetermined constant value.

SUMMARY OF THE INVENTION

Briefly according to this invention, there is provided a method of exposing a workpiece or the like to an electron beam to irradiate shapes upon the surface thereof. The electron beam is shaped into a narrow rectangular beam. The beam is swept over the workpiece surface in a direction perpendicular to the elongate axis of the beam cross section or at an acute angle to the perpendicular direction. The length of the beams is varied as the beam is moved. Also, the width of the beam is varied in accordance with the pattern to be exposed and concomitant with the movement of the beam. In one embodiment, the length and width of the beam are varied such that the width approaches zero as the length approaches maxima. According to a preferred embodiment the width of the beam cross-section is gradually reduced to zero as the beam is moved across the workpiece and to its furthest and widest extent. According to yet another embodiment, the width of the beam is increased from zero and to a constant width at which it remains as the beam is moved across the workpiece.

DESCRIPTION OF PREFERRED EMBODIMENTS

Figure 1:
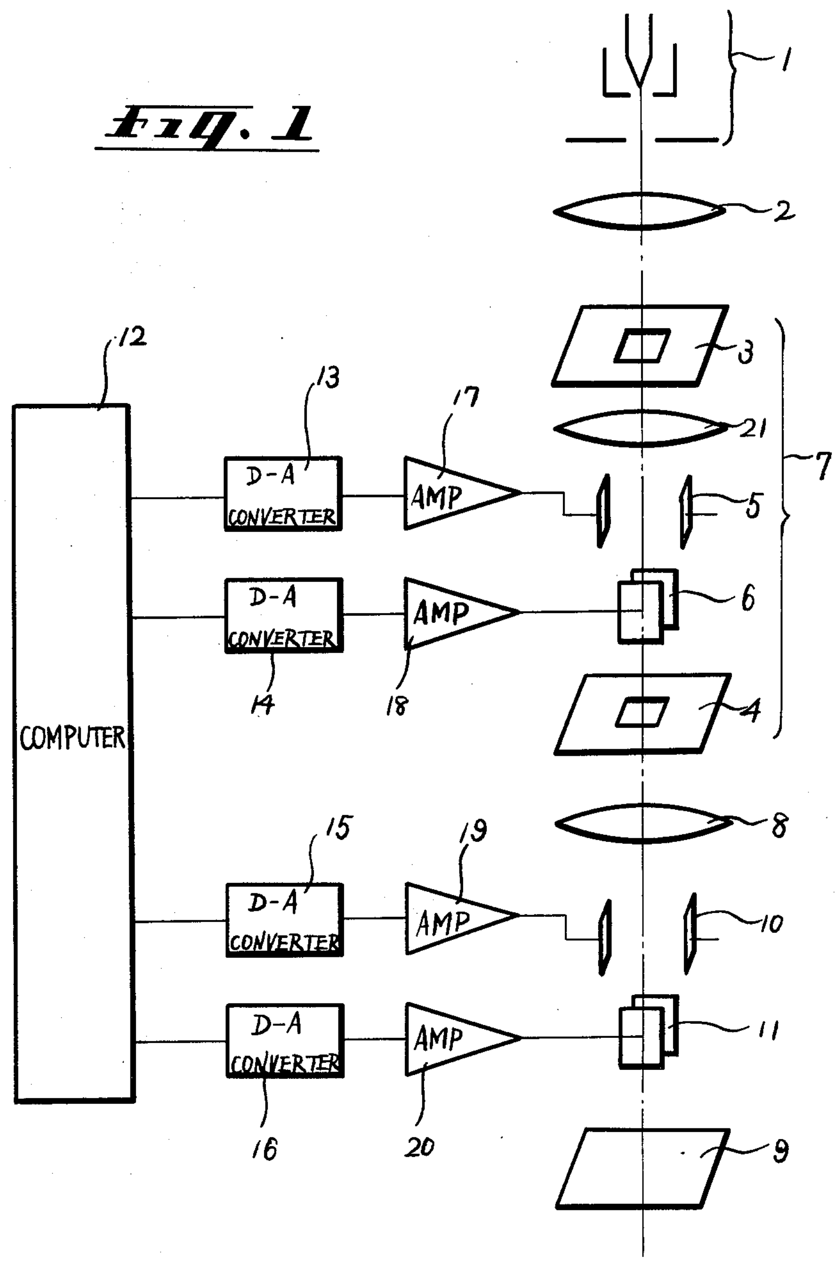

Further objects and advantages of this invention will become more readily apparent by reading the following detailed description with reference to the accompanying drawings of which:

FIG. 1 is a schematic drawing showing one embodiment of the subject invention, and FIGS. 2, 3, 4, 5, and 6 are drawings for explaining the operation of the embodiment according to FIG. 1.

Referring now to FIG. 1, an electron beam generated by an electron gun 1 is focused and shaped by a condenser lens 2 (shown schematically as the optical analog) and a beam cross section shaping means 7 comprising a first aperture plate 3, a second aperture plate 4, a condenser lens 21, an X deflector 5 and a Y deflector 6. The beam thus focused and shaped, is projected onto a workpiece 9 by a projector lens 8. The positioning of the projected beam on the surface of the workpiece 9 is carried out by means of X and Y deflector 10 and 11 located between the projector lens 8 and said workpiece 9. A digital computer 12, containing prestored data relevant to the patterns to be exposed, sends shape-designating signals to X and Y deflectors 5 and 6 via D-A converters 13 and 14, and amplifiers 17 and 18, respectively, and position-designating signals to X and Y deflectors 10 and 11 via D-A converters 15 and 16, and amplifiers 19 and 20, respectively.

Figure 2:
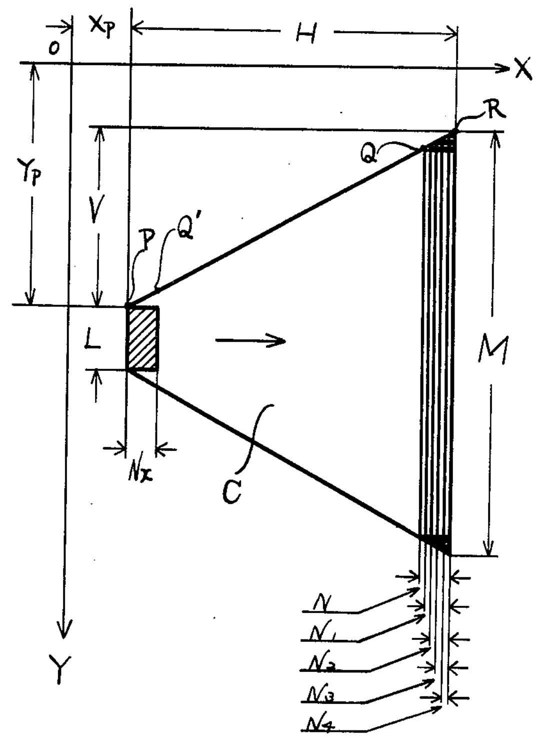

For example, if it is desired to expose a trapezium-shaped pattern as shown by C in FIG. 2, data appertaining to the lengths of the parallel sides L, M, the height H, the coordinates $X_P$, $Y_P$ of a reference point P of said trapezium C, and the width Nx of the narrow rectangular beam cross section are pre-stored in the computer 12. The computer 12 then sends shape-designating signals $V_{Nx}$ and $V_L$, based on said prestored data, to X and Y deflectors 5 and 6, thereby regulating said deflectors so as to form an electron beam having a cross-section measuring L×N. Similarly, said computer 12 sends position-designating signals $V_{XP}$ and $V_{YP}$ to X and Y deflectors 10 and 11, thereby regulating said deflectors to position said electron beam having a cross-section measuring L×N on the oblique line shown in FIG. 2.

Figure 3:
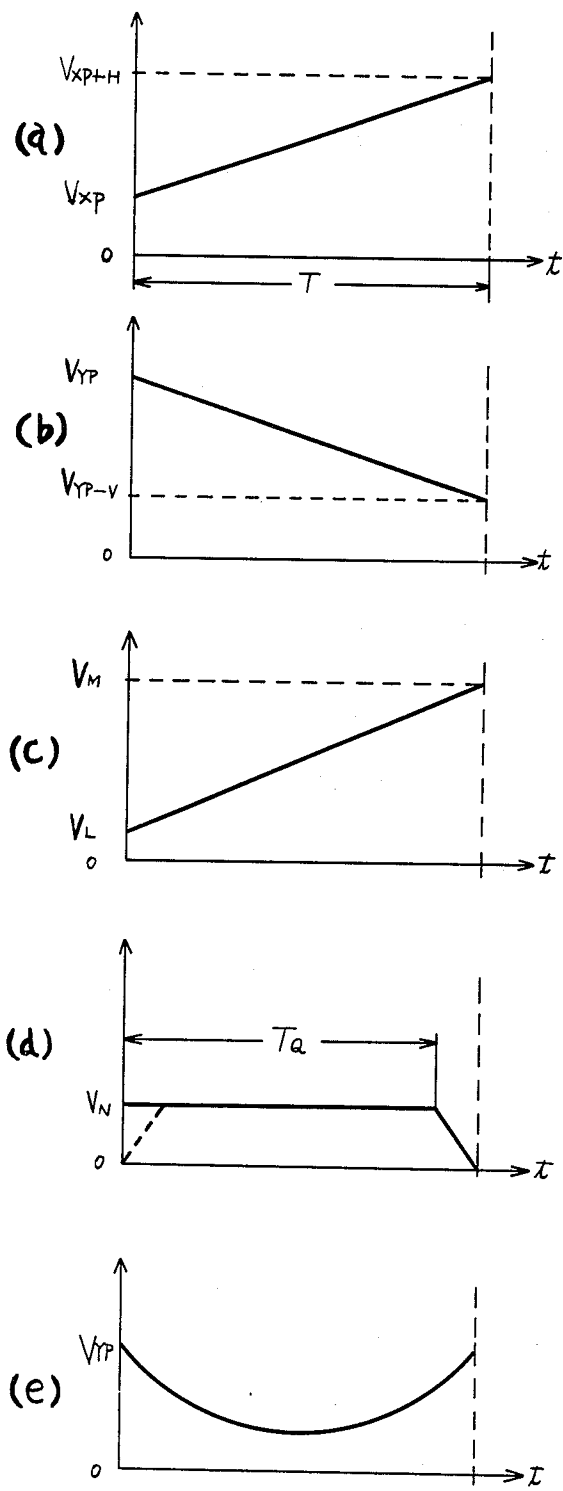

The position-designating signals $V_{XP}$ and $V_{YP}$ are then gradually varied during time T to become $V_{XP+H}$ and $V_{YP-V}$ as shown in FIG. 3(*a*) and (*b*), respectively. Accordingly, the electron beam positioned on said oblique line is shifted in the X- and Y-axis directions by the amounts H and V, respectively. The shape-designating signal $V_L$ being supplied to Y-deflector 5 then changes (during time T), concomitant with the scanning of the electron beam, to equal $V_M$, as shown in FIG. 3(*c*). Further, the shape-designating signal $V_{Nx}$ being supplied to X-deflector 6 remains constant during time $T_Q$ and then gradually decreases to zero during time $T-T_Q$ as shown in FIG. 3(*d*). Accordingly, the width of the electron beam between $P(X_P, Y_P)$ and $Q(X_Q, Y_Q)$ remains constant at N and then starts to gradually decrease (viz., $N<N_1<N_2<N_3<N_4 \ldots$) so that by the time the electron beam reaches R (the base line of the trapezium C), its width is zero.

Figure 4:
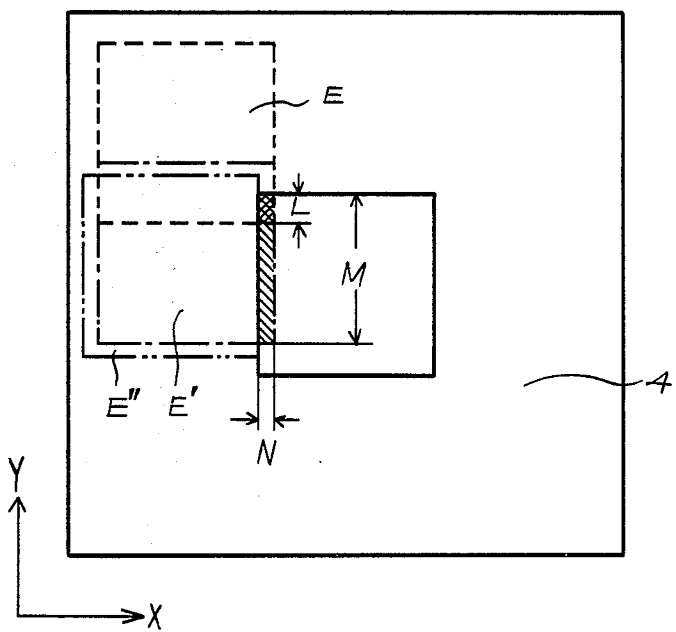

Referring now to FIG. 4, the electron beam E projected onto the second aperture plate 4 is shifted to E' during time T and to E'' during time $T-T_Q$.

Since then the length of the electron beam irradiating the workpiece increases from L to M, concomitant with electron beam shift in the X and Y directions, and the width of the electron beam, after remaining constant for a fixed period of time, decreases gradually to zero, a trapezuim-shaped pattern C as shown in FIG. 2 is exposed on the workpiece 9. Thus, by controlling the length of the cross-section of the electron beam, concomitant with electron beam shift in the X and Y directions, various patterns (trapeziums, trapezoids, triangles, etc.) can be exposed.

As heretofore described, a trapezium C as shown in FIG. 2 can be exposed by applying a constant shape-designating signal $V_{Nx}$ to the X-deflector 5 during time $T_Q(T_Q<T)$ and then gradually reducing the strength of the signal during time $T-T_Q$ so as to reach zero, as shown by the solid line in FIG. 3(*d*). Conversely, the same trapezium C can be exposed on the workpiece by shifting the electron beam in the opposite direction. That is to say, by gradually increasing the strength of the signal from zero to a constant value ($=V_N$) during the $T-T_Q$ and then keeping the strength of the signal constant during the remaining time $T_Q$ as shown by the broken line in FIG. 3(*d*). The width of the electron beam between R and Q gradually increase (viz., zero, . . . , $N_4$, $N_3$, $N_2$, $N_1$, N) and then between Q and P remains constant at N, so that the trapezuim-shaped pattern C as shown in FIG. 2 is exposed on the workpiece 9.

Figure 5:
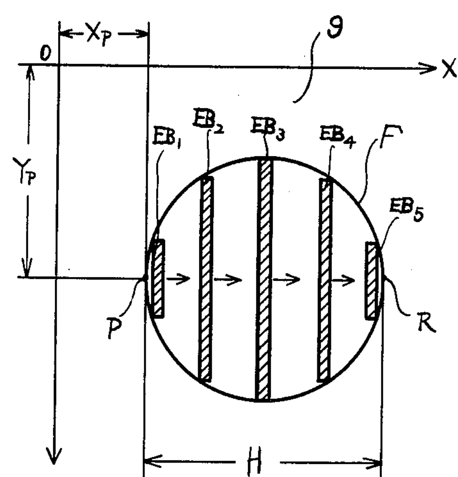

If the position designating signals $V_{XP}$ and $V_{YP}$ (FIG. 3(*a*), (*b*)) are varied so as to make the electron beam follow a semi-circular arc PQR and the length of the cross section is continuously varied through zero $EB_1 \rightarrow EB_2 \rightarrow EB_3 \rightarrow EB_4 \rightarrow EB_5 \rightarrow$ zero, a circle F, as shown in FIG. 5 is exposed on the workpiece.

Figure 6:
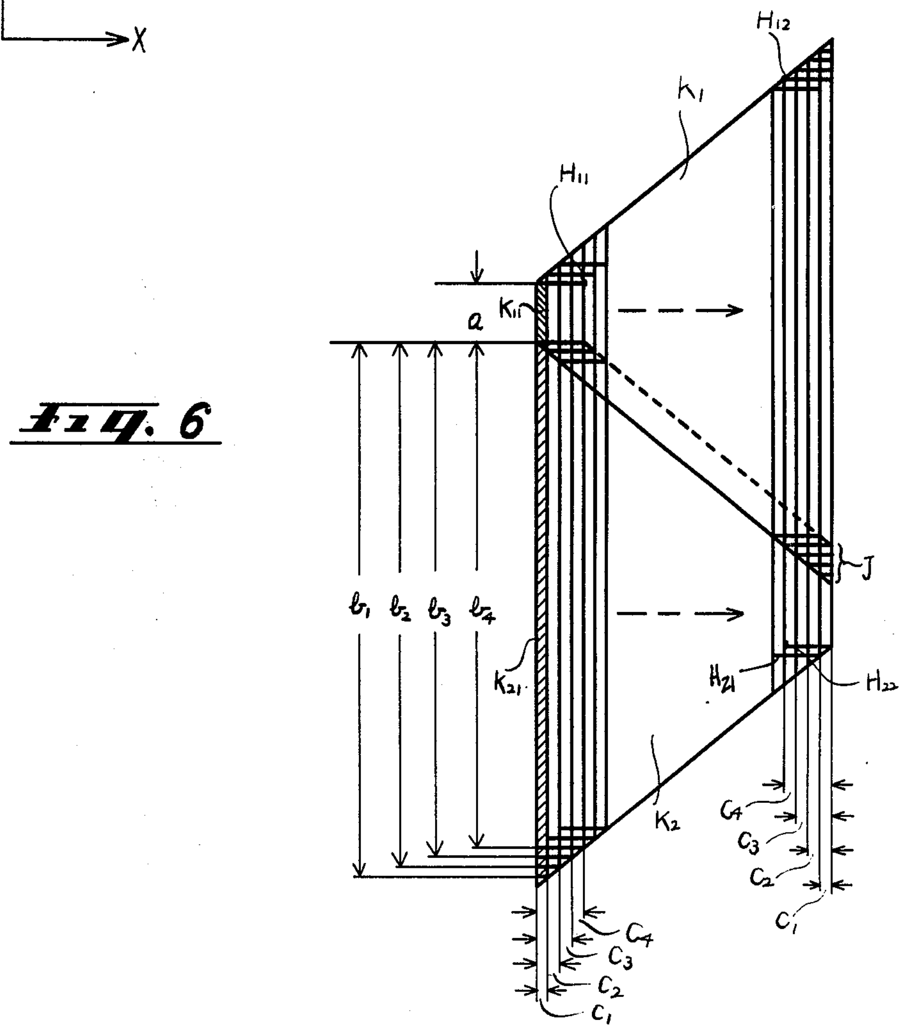

It is also possible to expose a plurality of linked patterns. For example, if it is desired to expose trapeziums $K_1$ and $K_2$ as shown in FIG. 6, the procedure is the same as for the trapezium shown in FIG. 2 but in duplicate. That is to say, in the case of trapezium $K_1$, the X and Y deflectors 5 and 6 operate to control the electron beam so that initially the length and width of the beam cross-section measure "a" and $c_1(c_1 \approx o)$, respectively. As exposure progresses, the width "c" of said beam cross section is gradually increased to $c_2$, $c_3$, $c_4$, as far as point $H_{11}$, during which time, the length "a" remains constant. Between $H_{11}$ and $H_{12}$, the width remains constant at $c_4$ while the length is gradually increased. After which (i.e., between $H_{12}$ and the top edge of $K_1$), the width is gradually decreased from $c_4$, through $c_3$, $c_2$ and $c_1$, down to zero. Similarly, in the case of trapezium $K_2$, the X and Y deflectors operate to control the electron beam so that initially the length and width of the beam cross section measure $b_1$ and $c_1(c_1 \approx o)$, respectively. As exposure progresses, the length $b_1$ of said beam cross section is gradually decreased from $b_1$ to $b_2$, $b_3$ and $b_4$ up as far as point $H_{21}$, during which time, the width $c_1$ is gradually increased to $c_2$, $c_3$, $c_4$. Between $H_{21}$ and $H_{22}$, the length "b" continues to decrease while the width remains constant at $c_4$. After which, (i.e., between $H_{22}$ and the top edge of $K_2$), the width is gradually decreased from $c_4$, through $c_3$, $c_2$ and $c_1$, down to zero.

By exposing the workpiece as aforedescribed, sharp pattern edges are assured. Also, since exposure overlapping takes place as shown in FIG. 6 by J, since the exposure frequency at the edges of the pattern is the same as that of the main body of the pattern, exposure uniformity is high.

Lastly, although in the aforedescribed embodiment a computer is used and electron beam positioning and shaping are carried out by prestoring a predetermined program, it goes without saying that other forms of control (hardware) could readily be substituted in lieu thereof, thereby enabling high speed exposure.

Having thus described our invention in the detail and particularity required by the Patent Laws, what is desired protection by Letters Patent is set forth in the following claims.

We claim:

1. An electron beam exposure method for projecting an electron beam having a selectable cross section onto a workpiece, said method comprising the steps for:
   A. controlling the electron beam to produce an elongate rectangular cross section,
   B. projecting said electron beam onto a workpiece,
   C. deflecting said projected electron beam over the workpiece, and
   D. varying the length of the cross section of the beam in accordance with the pattern to be exposed and concomitant with the deflection of the electron beam.

2. An electron beam exposure method according to claim 1 in which step A is carried out by deflecting the image of one aperture plate upon a subsequent apertured plate with a deflector arranged therebetween.

3. An electron beam exposure method for projecting an electron beam having a selectable cross section onto a workpiece, said method comprising the steps for:
   A. controlling the electron beam to produce an elongate rectangular cross section,
   B. projecting said electron beam onto a workpiece,
   C. deflecting said projected electron beam over the workpiece,
   D. varying the length of the cross section of the beam in accordance with the pattern to be exposed and concomitant with the deflection of the electron beam and
   E. varying the width of the cross section of the beam in accordance with the deflection of the electron beam.

4. An electron beam exposure method according to claim 3 in which step A is carried out by deflecting the image of one apertured plate upon a subsequent apertured plate with a deflector arranged therebetween.

5. A method according to claim 3, in which the length and width of the beam cross section are varied such that the width approaches zero as the length approaches maxima.

6. A method according to claim 3, in which the width of the cross section of the electron beam is gradually reduced to zero as the beam is moved across the workpiece.

7. A method according to claim 3, in which the width of the cross section of the electron beam is increased from zero to a fixed value at which it remains as the beam is moved across the workpiece.

* * * * *

Notice of Adverse Decision in Interference

In Interference No. 100,474, involving Patent No. 4,151,422, E. Goto, T. Souma, M. Idesawa and T. Yuasa, ELECTRON BEAM EXPOSURE METHOD, final judgment adverse to the patentees was rendered Dec. 31, 1980, as to claims 1 and 2.

[*Official Gazette April 14, 1981.*]